(12) United States Patent
Arena

(10) Patent No.: US 8,367,520 B2
(45) Date of Patent: Feb. 5, 2013

(54) METHODS AND STRUCTURES FOR ALTERING STRAIN IN III-NITRIDE MATERIALS

(75) Inventor: Chantal Arena, Mesa, AZ (US)

(73) Assignee: Soitec, Bernin (FR)

( * ) Notice: Subject to any disclaimer, the term of this patent is extended or adjusted under 35 U.S.C. 154(b) by 557 days.

(21) Appl. No.: 12/563,327

(22) Filed: Sep. 21, 2009

(65) Prior Publication Data

US 2010/0072576 A1    Mar. 25, 2010

Related U.S. Application Data

(60) Provisional application No. 61/098,944, filed on Sep. 22, 2008.

(51) Int. Cl.
   H01L 29/20    (2006.01)
   H01L 21/18    (2006.01)
(52) U.S. Cl. .......... 438/459; 257/E21.087; 257/E29.089
(58) Field of Classification Search ................... 438/459; 257/E21.087, E29.089
   See application file for complete search history.

(56) References Cited

U.S. PATENT DOCUMENTS

| | | |
|---|---|---|
| 5,225,358 A | 7/1993 | Pasch |
| 6,214,698 B1 | 4/2001 | Liaw et al. |
| 6,303,468 B1 | 10/2001 | Aspar et al. |
| 6,335,258 B1 | 1/2002 | Aspar et al. |
| 6,756,286 B1 | 6/2004 | Moriceau et al. |
| 6,809,044 B1 | 10/2004 | Aspar et al. |
| 6,852,652 B1 | 2/2005 | Maa et al. |
| 6,946,365 B2 | 9/2005 | Aspar et al. |
| RE39,484 E | 2/2007 | Bruel |
| 2001/0008791 A1 | 7/2001 | Gehrke et al. |
| 2004/0253792 A1 | 12/2004 | Cohen et al. |
| 2007/0022940 A1 | 2/2007 | Boussagol et al. |
| 2008/0197358 A1 | 8/2008 | Frahm et al. |

FOREIGN PATENT DOCUMENTS

| | | |
|---|---|---|
| EP | 1 255 135 A2 | 11/2002 |
| FR | 2 894 989 A1 | 6/2007 |

OTHER PUBLICATIONS

German Office Action for Application No. DE 10 2009 042 324.9 dated Mar. 18, 2011.
International Search Report from the French Institut National de la Propriété Industrielle for Application No. FR 0805478 to SOITEC, dated Oct. 3, 2008, 9 pages.
Cohen, G.M. et al., "Free standing silicon as a compliant substrate for SiGe," Mat. Res. Soc. Symp. Proc., vol. 768 (2003), 6 pages.
Mooney, P.M., et al., "Elastic strain relaxation in free-standing SiGe/Si structures," Applied Science Letters, vol. 84, No. 7 (Feb. 16, 2004), pp. 1093-1095.
H. Amano et al., Metalorganic Vapor Phase Epitaxial Growth of a High Quality GaN Film Using an AlN Buffer Layer to Amano et al., Appl. Phys. Lett., 48(5), Feb. 1986, pp. 353-355.

*Primary Examiner* — David S Blum
(74) *Attorney, Agent, or Firm* — TraskBritt

(57) ABSTRACT

Methods and structures for producing semiconductor materials, substrates and devices with improved characteristics are disclosed. Structures and methods for forming reduced strain structures include forming an interface between a support structure surface and a strained semiconductor layer. The support structure is selectively etched to form a plurality of semiconductor islands with reduced levels of strain.

16 Claims, 5 Drawing Sheets

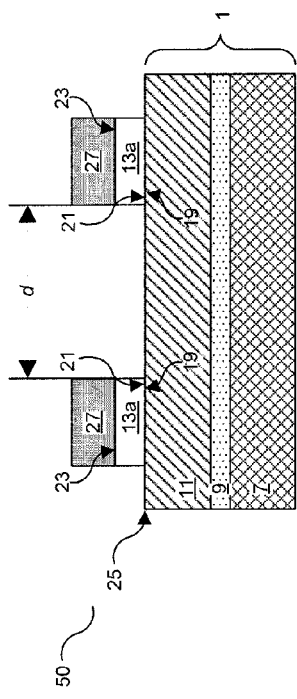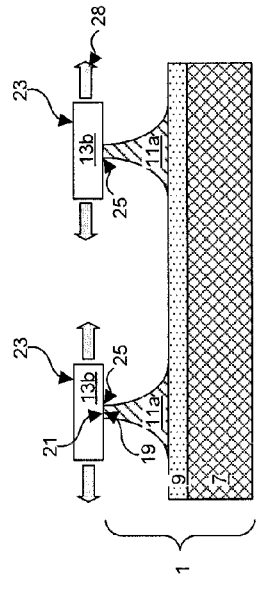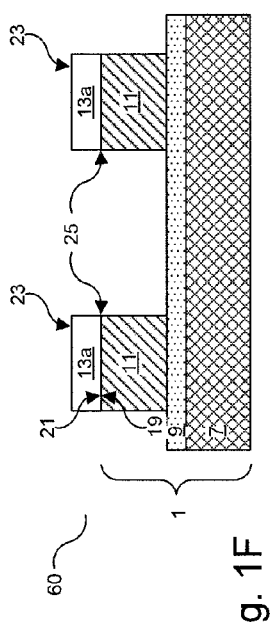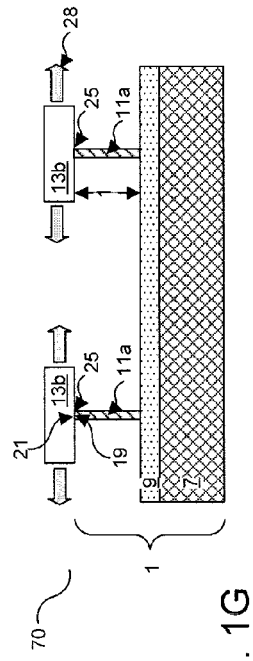

METHODS AND STRUCTURES FOR ALTERING STRAIN IN III-NITRIDE MATERIALS

CROSS-REFERENCE TO RELATED APPLICATION

This application claims the benefit under 35 U.S.C. §119(e) of U.S. Provisional Application No. 61/098,944, filed Sep. 22, 2008, which is incorporated herein by reference.

BACKGROUND OF THE INVENTION

Field of the Invention

The various embodiments of the present invention generally relate to the fabrication of semiconductor structures and devices. The various embodiments provide—method and structures for producing semiconductor materials, substrates and devices with improved characteristics.

Strained layers of semiconductor materials can be undesirable for a number of reasons. Strain in the semiconductor layers can result in an increased density of defects, crack formation and phase separation, in broad terms, a possible reduction in material quality.

Strain effects can be disadvantageous in fabricating III-V semiconductor materials such as the III-nitrides. For example, consider III-nitride-based light emitting devices containing indium gallium nitride ($In_xGa_{1-x}N$) with significant indium content (e.g., x>0.15). The increased indium content preferred in such devices, for extending the emission wavelength range, commonly introduces disadvantageous levels of strain due to lattice mismatch with adjoining layers. The strained layers commonly have restricted thicknesses and low indium content in an attempt to prevent material phase separation and subsequent non-uniform indium distribution.

In more detail, the components of the binary compound InGaN, namely InN and GaN are not fully miscible and therefore under a given set of growth conditions and film thickness there is a fixed range of energetically favorable InGaN compositions. The introduction of lattice strain and defects into the InGaN system can result in thicker InGaN layers grown at energetically unfavorable compositions tending to phase separate i.e., the material is no longer of a single composition and the In and Ga atoms will not be homogenously distributed throughout the layer. The non-homogeneity in the InGaN material can result in a deterioration of the efficiency of III-nitride-based devices.

Therefore, the previously outlined approaches can be impractical for achieving material goals relating to substantially single phase, strain relaxed materials with desired compositions. As a result, methods and structures are desired for producing low defect density, strain relaxed semiconductor layers.

U.S. patent application Ser. No. 10/460,628, filed Jun. 13, 2003 by Moshe et al. (U.S. Patent Application NO. 2004/0253792), discloses the epitaxial deposition of a silicon germanium (SiGe) layer on a underlying silicon-on-insulator (SOI) base and the introduction of strain into the upper silicon portion of the SOI base through the relaxation of the SiGe. The relaxation process is produced by selectively etching the insulating component ($SiO_2$) of the SOI base to produce a pedestal and free-standing semiconductor structure.

Mooney et al. in "Elastic strain relaxation in free-standing SiGe/Si structures" (Applied Physics Letter, 84(7), p. 1093, 2004) discloses the formation of a $SiO_2$ pedestal and free-standing Si structure utilizing the selective etching of a SOI substrate. The structure was subsequently utilized as a base for epitaxial deposition of a layer of SiGe and the relaxation of the SiGe layer.

Semiconductor layers grown heteroepitaxially to an underlying substrate may be undesirably strained due to lattice mismatch between the dissimilar layers. The composition of semiconductor layers can therefore be restricted and the quality impacted. Methods and structures for providing semiconductor layers with reduced strain and preferred compositions are therefore desirable.

SUMMARY OF THE INVENTION

The various embodiments of the present invention generally provide methods and structures for fabricating semiconductor layers with reduced levels of strain, substantially free of phase separation. The methods are now briefly described in terms of certain embodiments of the invention. This summary is provided to introduce a selection of concepts in a simplified form that are further described in the detailed description of the embodiments of the invention. This summary is not intended to identify key features or essential features of the claimed subject matter, nor is it intended to be used to limit the scope of the claimed subject matter.

The embodiments of the invention provide methods for forming a semiconductor structure; the methods include forming a bonding interface between a bonding surface of a strained semiconductor layer and a bonding surface of a support structure. The semiconductor layer and the bonding surface of the support structure are selectively etched resulting in the exposure of the adjoining areas of the bonding surface of the semiconductor layer. Exposing the bonding surface of the semiconductor layer produces a plurality of the semiconductor islands, the semiconductor islands having a reduced level of strain compared with the semiconductor material prior to the processes of the embodiments.

As stated, the processes involve removing selected areas of the bonding surface of the support structure, which comprises applying a masking material to the surface of a free face of the semiconductor layer and anisotropically etching the unmasked areas of the semiconductor layer to reveal areas of the support structure. An isotropic etch process is performed to remove portions of the support structure.

In one embodiment of the invention, device structures can be formed on the semiconductor islands with reduced levels of strain and substantially phase-separation free. Device structures can include electronic, optoelectronic, photovoltaic, optical, microelectromechanical systems, etc.

Further embodiments of the invention utilize the plurality of semiconductor islands with reduced levels of strain (substantially free of phase separation) for forming a substantially continuous layer of semiconductor material, wherein the continuous layer of semiconductor material inherits the properties of the underlying semiconductor islands. Methods for forming the substantially continuous layer of semiconductor material include performing lateral growth from the free surfaces of the plurality of semiconductor islands with reduced levels of strain. Additional embodiments also include the deposition, reflow and planarization of a layer of reflowable glassy material.

In certain embodiments, the semiconductor material in the processes outlined above comprises a III-nitride material, including gallium nitride, indium nitride, aluminum nitride and mixtures thereof.

Additional methods of the embodiments are intended to reduce the amount of strain in III-nitride structures including bonding a strained III-nitride layer to a support structure. In particular embodiments of the invention, the support structure may include an etch stop layer. The etch stop layer may comprise a dielectric material, which is capable of substantially preventing the nucleation of III-nitride materials.

The III-nitride material is selectively etched to expose the support structure and further selective lateral etching is performed into the support structure. The selective etching of the III-nitride layer may be performed utilizing a dry etch process comprising anisotropic plasma etching, whereas the selective etching of the support structure may be performed utilizing a wet chemical etch process.

Further methods of the embodiments comprise forming a continuous III-nitride layer with reduced levels of strain and substantially phase-separation free by performing lateral growth from the unetched portions of the III-nitride layer. In certain embodiments, additional processes can include the deposition, reflow and planarization of a reflowable glassy material.

Further embodiments of the invention utilize the continuous III-nitride layer with reduced levels of strain, substantially free of phase separation in a number of ways. In certain embodiments, device structures are formed on the continuous layer of III-nitride material. The classes of device structures that can be formed have previously been outlined. In other embodiments of the invention a portion of the continuous layer of III-nitride material is detached such detachment can be produced utilizing ion implantation or alternatively a plurality of voided regions formed during the lateral growth process.

The various embodiments of the invention also include structures formed during the processes previously outlined. A certain embodiment of the invention includes a semiconductor structure including a III-nitride island with reduced levels of strain. The III-nitride island may also including a free surface with a surface area of approximately less than $2.5 \times 10^5$ μm$^2$ and may be composed of substantially single phase indium gallium nitride with an indium percentage approximately less than 25%.

The structure can also include a support structure comprising one or more elements including a base material, an etch stop layer and a sacrificial layer, wherein one element can have multiple functions. Certain embodiments of the invention include a bonding interface between a bonding surface of the III-nitride island and a bonding surface of the support structure, wherein the surface area of the bond surface of the III-nitride islands is approximately greater than the surface area of the bonding surface of the support structure.

The embodiments of the invention include further structures produced from those previously outlined. The further structures include a plurality of the semiconductor structures previously outlined wherein the free surface of the III-nitride islands are substantially within the same horizontal plane and are separated at their periphery by a distance of approximately less than 30 μm. The further semiconductor structure also includes additional III-nitride material adjacent to the free surface of the III-nitride islands thereby forming a substantially continuous layer of III-nitride material. In particular embodiments the substantially continuous layer of III-nitride material comprises substantially single phase indium gallium nitride with an indium percentage approximately greater than 25%.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiments of the present invention, illustrative examples of specific embodiments of the invention and the appended figures in which:

FIGS. 1A-1G schematically illustrate specific embodiments of the invention for reducing the level of strain in semiconductor structures.

DETAILED DESCRIPTION OF THE INVENTION

Figure 1A:
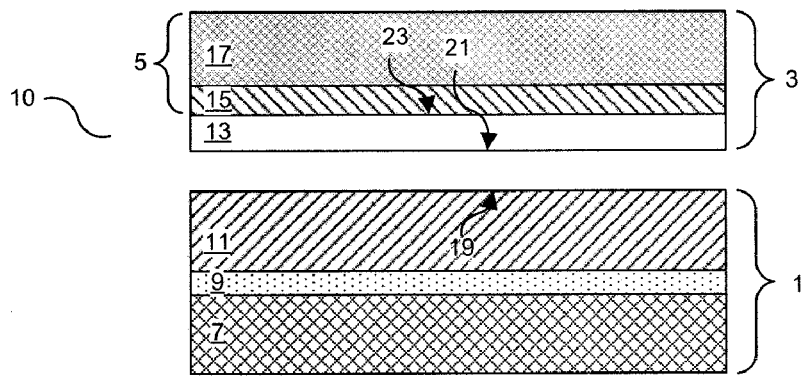

The embodiments of the invention comprise methods and structures for reducing the level of strain and substantially preventing phase separation in heteroepitaxially grown semiconductor layers and the formation of structures, substrates and devices from such layers. The following description commences with a brief summary of embodiments of the invention followed by a more detailed description.

The term "substantially" is used herein to refer to a result that is complete except for the deficiencies normally expected in the art. For example, an epitaxial layer cannot routinely be expected to be completely continuous (or completely monocrystalline, or completely of one crystal polarity, or completely of single compositional phase) across macroscopic dimensions. However, an epitaxial layer can routinely be expected to be "substantially continuous" (or "substantially monocrystalline," or "substantially of one crystal polarity," or "substantially of a single compositional phase") across macroscopic dimensions where the discontinuities (or crystal domains, or crystal boundaries) present are those expected in the art for the processing conditions, the material quality sought, and so forth.

The term "critical thickness" refers to a thickness at which strain is sufficient in an epitaxial layer to cause defect formation to reduce the level of strain.

The term "reduced levels of strain" refers herein to a level of strain, for a given composition, that is less than the level of strain present at the critical thickness for the formation of crystal defects during heteroepitaxial growth.

The embodiments have applications to epitaxially growing a wide range of semiconductor materials and combinations thereof, both elemental semiconductors and compound semiconductors. For example, it can be applied to combinations of Si (silicon) and/or Ge (germanium). It can also be applied to groups II-VI and groups III-V compound semiconductor materials. Particular applications are to growing pure or mixed nitrides of the group III metals (III nitrides) (e.g., GaN, InGaN, AlGaN, etc.) with reduced levels of strain.

However, for conciseness and convenience of the following description and without intended limitation, the invention is described herein primarily in embodiments directed to growing III-nitrides, and particularly in embodiments directed to forming InGaN and GaN materials. This descriptive focus is only for example, and it should not be taken as limiting the invention. In fact, as will be apparent from the subsequent description and appended figures, the methods of the embodiments can readily be applied to growing group III-V compound semiconductors generally, to growing compound semiconductors belonging to other groups (e.g., group II-VI), and to growing elemental and alloy semiconductors. Therefore, it is without limitation that the description herein focuses primarily on embodiments of the invention directed to III nitrides and to GaN.

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein. Briefly, methods of the embodiments of the invention commence with the formation of a strained semiconductor layer on a support structure utilizing bonding and separation of strained material from a suitable donor structure. Strain in the semiconductor layer is commonly produced by the heteroepitaxial deposition of the semiconductor on a lattice mismatched substrate. The strained semiconductor can be deposited directly on a substrate and subsequently bonded to a support structure or alternative the strained semiconductor can be grown on a suitable substrate and subsequently transferred to an intermediate support prior to bonding to the support structure. The strained semiconductor layer may be deposited below the critical thickness to prevent the formation of additional defects in the material and also substantially prevent phase separation.

A surface of donor structure comprising a strained semiconductor layer (the bonding surface of the strained semiconductor) is brought into contact and adhered to a surface of the support structure (the bonding surface of the support structure), forming a bonding interface between the two articles. Upon bonding of the semiconductor layer to the support structure, the lattice mismatched growth substrate (or alternatively the intermediate support) can be removed using techniques known in the art.

The surface of the strained semiconductor layer opposed to the bonding surface (referred to as the "free" surface) is patterned with a masking material such that areas of the free surface are either exposed or covered by masking material. Exposed portions of the strained semiconductor layer are anisotropically selectively etched, the etch process exposing the underlying bonding interface between the semiconductor and the support structure, thereby forming a plurality of isolated semiconductor regions.

Additional etch processes are utilized to selectively remove portions of the support structure not only in exposed regions but also in masked regions (i.e., regions beneath the semiconductor layer), thereby undercutting the semiconductor material and producing a plurality of elevated semiconductor islands. In certain exemplary embodiments, the additional etch processes comprise anisotropic followed by isotropic (lateral) etching or alternative primarily isotropic (lateral) etching.

A portion of the bonding interface between the plurality of semiconductor islands and the support structure is maintained to provide mechanical support structure. Therefore, a plurality of structures is produced comprising elevated islands of semiconductor material supported upon a foundation column of support structure material. Removal of the strain maintaining support structure from areas of the semiconductor islands result in reduced levels of strain in the semiconductor islands.

Further embodiments of the invention include utilizing the elevated islands of semiconductor material supported upon a foundation column of support material for the formation of continuous layers of semiconductor material with reduced levels of strain, substantially free of phase separation. Such methods utilize the free surface of the semiconductor islands as seed crystals for lateral overgrowth processes, either with or without additional deposition and planarization processes. Lateral growth of additional semiconductor material is continued from the island seed crystals until coalescence occurs, forming a substantially continuous film of additional semiconductor material. Growth of additional semiconductor material is then continued until a desired thickness is attained. The continuous film of substantially strain free material is also substantially of a single compositional phase (i.e., free of phase separation). Since the additional semiconductor material is seeded from islands with reduced levels of strain, the additional semiconductor material can have increased thickness or more desirable compositions with reduced likelihood of phase separation. The semiconductor material produced by embodiments of the invention can be utilized in its current condition, or portions can be detached and transferred for the formation of alternative semiconductor structures, for example composite substrates.

Embodiments of the invention relating to producing semiconductor materials with reduced levels of strain, substantially free of phase separation, are now described in greater detail with further reference to FIGS. 1A-1G utilizing the III-nitride materials system as a non-limiting example. The embodiments of the invention commence with intermediate structure 10 illustrated in FIG. 1A.

Intermediate structure 10 comprises support structure 1 and donor structure 3. Support structure 1 is illustrated as comprising multiple elements including sacrificial layer 11, etch stop layer 9 and base support layer 7. It should be noted that both the etch stop layer 9 and the base support layer 7 are elective components of the support structure 1 and therefore one or both elements can be omitted. In addition, a single element of the support structure 1, may be multifunctional (i.e., a single element could comprise an etch stop layer and base support layer etc.). For example, a single layer of material could constitute both sacrificial layer 11 and base support layer 7 (e.g., the etch stop layer 9 being omitted and a silicon oxide substrate providing both the sacrificial layer 11 and the base support layer 7). Also a single material could function as both etch stop layer 9 and base support layer 7 (e.g., a silicon oxide sacrificial layer 11 and a sapphire etch stop/base support layer 7). In addition, the support structure 1 can comprise additional layers depending on the desired properties of the support structure 1, additional layers could include further etch stop layers, sacrificial layers, bonding layers, etc.

In certain embodiments of the invention, sacrificial layer 11 comprises a material capable of being selectively isotropically etched (i.e., etching in which the rate of the etch reaction is substantially non-directional, that is, etching in all directions simultaneously), and may comprise materials that are commonly etched with liquid etchants, including oxides ($SiO_2$, ZnO), nitrides ($Si_xN_x$), III-Vs (GaAs, InP), metals, polymers, etc. Bonding surface 19 of support structure 1 (i.e., of sacrificial layer 11) preferably has characteristics (i.e., surface roughness and surface chemistry to provide a high quality bonding interface with donor structure 3). In a certain embodiment, the bonding surface of the support structure has a surface roughness of approximately less than 15 Å.

Etch stop layer 9 comprises a material that has a very low etch selectivity in relation to the sacrificial layer 11, wherein the etch selectivity is given as the etch rate of the etch stop layer 9/etch rate of sacrificial layer 11. In certain embodiments, the etch stop layer 9 can comprise dielectric materials, for example silicon oxides and silicon nitrides. In addition, the properties of the etch stop layer 9 may also prevent nucleation of further semiconductor material in subsequent process stages of the invention.

The base support structure can comprise a homogenous base including sapphire, silicon, silicon oxides, silicon nitrides, III-V's or a heterogeneous base including silicon-on-insulator (SOI), SiC-on-insulator (SICOI) etc.

Donor structure 3 comprises composite substrate 5 and a strained semiconductor layer 13. As a non-limiting example the strained semiconductor layer 13 comprises indium gallium nitride (InGaN). Composite substrate 5 comprises base 17 and an elective intermediate layer 15, as a non-limiting example the base 17 comprising sapphire and elective intermediate layer 15 comprising gallium nitride (GaN). It should be appreciated that the base 17 can comprise a homogenous substrate (e.g., GaN) or a heterogeneous substrate comprising two or more materials (e.g., GaN on sapphire (GaNOS), GaN on insulator (GaNOI)). Strained semiconductor layer 13 can be formed on the composite substrate either by direct deposition or via transfer from an intermediate support structure (not shown).

Direct deposition of the strained semiconductor layer 13 may involve intermediate layer 15, for example the intermediate layer 15 may comprise a material to aid in the deposition of the strained semiconductor layer 13 if direct deposition on the base 17 is problematic. For example, the intermediate layer 15 may comprise gallium nitride on base 17 (e.g., sapphire) to aid in the deposition of the strain semiconductor layer 13. In other embodiments, the intermediate layer 15 may be omitted if the base provides a high quality surface for direct deposition of the strained semiconductor layer 13. For example, a free-standing (FS) gallium nitride wafer could comprise the base 17, in which case a strained InGaN layer could be directly deposited on the base 17 without the need for an intermediate layer 15.

In alternative embodiments, the strained semiconductor layer 13 is deposited on an intermediate support structure (not shown) and then transferred to composite substrate 5 utilizing methods of bonding and layer transfer, as known in the art. Such transfer processes substantially maintain the strain in the semiconductor material but are capable of altering the polarity. For example, InGaN is commonly grown with metal-polarity (i.e., Ga-polar), however it can be advantageous in certain embodiments to bond and transfer a portion of the Ga-polar material to composite substrate 5, in which case the material would be inverted to nitrogen polarity (N-polar) due to the nature of the transfer process, as known in the art. In such examples, intermediate layer 15 can comprise a bond assisting layer to aid in the adhesion of the strained layer to the composite substrate. For example, the intermediate layer 15 could comprise a silicon oxide or silicon nitride material to assist in the bonding of a transferred InGaN layer from an intermediate support structure.

Either by direct deposition or transfer from an intermediate support structure the strain in the semiconductor layer 13 is commonly produced due to the lattice mismatch between the semiconductor layer and a growth substrate. The strained semiconductor layer 13 is commonly deposited below or about the critical thickness for the formation of defects due to strain relaxation, thereby preventing a significant increase in the density of defects in the semiconductor material and the on-set of phase separation. For example, for $In_{0.15}Ga_{0.85}N$, the critical thickness is approximately 20 nm, whereas for $In_{0.25}Ga_{0.75}N$, the value is expected to be in the range of a few nanometers. The semiconductor layer, for example, a III-nitride material, can be deposited by various techniques known in the art including, metallorganic vapor phase epitaxy (MOVPE), halide (or hydride) vapor phase epitaxy (HVPE), molecular beam epitaxy (MBE). As with bonding surface 19 of support structure 1, bonding surface 21 of the strained semiconductor layer 13 has sufficiently high quality (i.e., atomic roughness of less than approximately 15 Å).

Intermediate structure 20 (FIG. 1B) is formed by bringing into direct contact support structure 1 and donor structure 3, such that the bonding surface 19 of the support structure 1 is brought into contact with the bonding surface 21 of the strained semiconductor layer 13, thereby producing bonding interface 25. For example, bonding interface 25 can be produced by anodic, direct or adhesive bonding. The quality of bonding interface 25 can be further improved via methods known in the art, such as high temperature, high pressure bonding as well as pre-bond cleaning techniques such as wet chemical and reactive plasma cleaning.

Figure 1B:
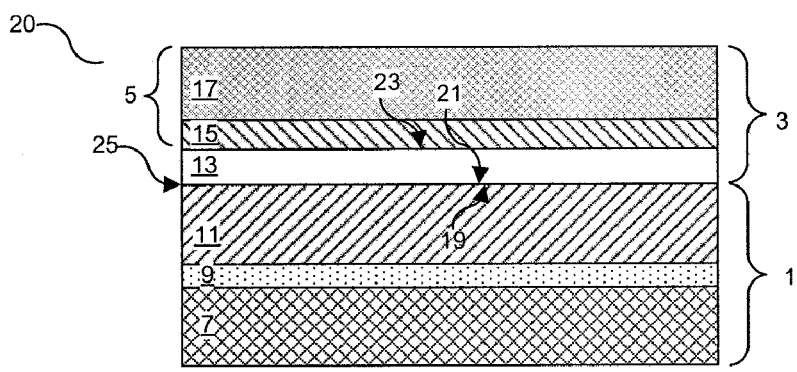
Figure 1C:
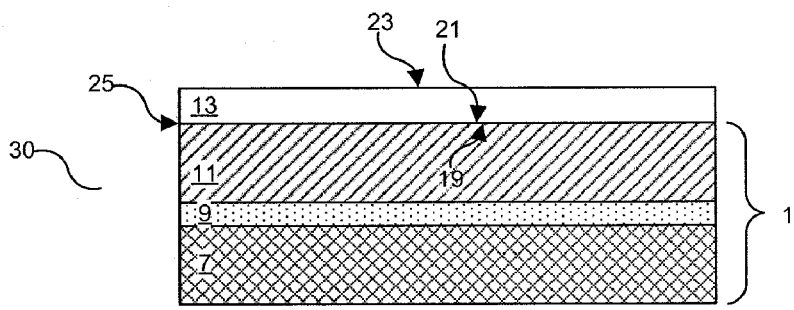

Upon formation of bonding interface 25, the composite substrate 5 portion of the donor structure 3 is removed from intermediate structure 20 of FIG. 1B. Composite substrate 5 is removed to allow access to free surface 23 of the strained semiconductor material 13. The free surface 23 can comprise metal-polar, nitrogen-polar, semi-polar or non-polar material and it should be noted that the polarity of the free surface 13 may be opposite to that of the bonding surface 21 for polar III-nitrides. Removal of composite substrate 5 (as illustrated in FIG. 1C) also removes the lattice mismatched element from the strained semiconductor material; however, the strain in the material is substantially maintained by bonding interface 25. Composite substrate 5 can be removed by a number of techniques known in the art such as laser lift-off, etching, grinding, or ion implantation techniques such as those known as SMART CUT™.

Figure 1D:
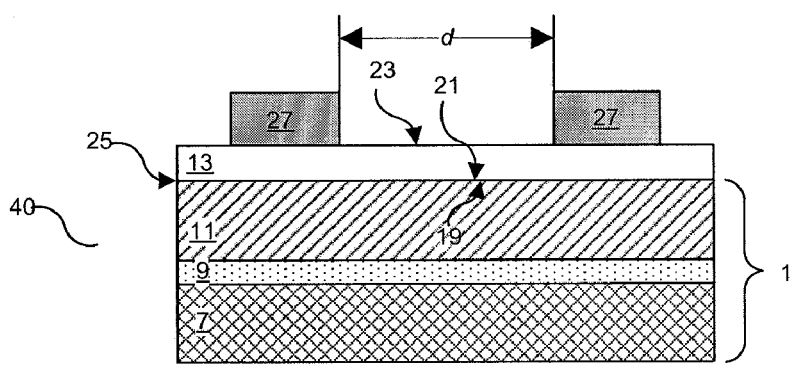

Upon removal of the composite substrate from intermediate structure 20, the resultant structure, intermediate structure 30, is selectively masked with masking material 27, as illustrated in FIG. 1D to form intermediate structure 40. The formation of masking material 27 at selected locations on the free surface 23 of the strained semiconductor layer 13 can be produced using well-known processes in the art such as those utilizing photosensitive chemicals and photolithography techniques, as well as deposition of masking material and patterned etching of the masking material. Masking materials can include photosensitive polymers, dielectrics and metallic materials.

Masking material 27 is utilized to protect selected areas of semiconductor layer 13 during subsequent etch processes, whilst leaving exposed areas open to etching (i.e., areas d shown in FIG. 1D). The etch processes are initially utilized to substantially anisotropically (etching in which the etch rate in the direction normal to the surface is much higher than in the direction parallel to the surface) remove unmasked regions of semiconductor layer 13 to produce isolated semiconductor regions 13a as shown in FIG. 1E. An anisotropic etch of the semiconductor material is preferable in certain embodiments to substantially prevent the strained semiconductor material from being laterally etched thereby increasing the subsequent lateral growth distance between seed crystals required for coalescence, this distance d between growth fronts will be discussed later in further detail.

In the embodiment illustrated in FIG. 1E, the anisotropic etch process is illustrated as having etched through the strained semiconductor layer 13 to expose sacrificial layer 11 of support structure 1. The anisotropic etch of the strained semiconductor material (i.e., a III-nitride material) maintains the bonding interface 25 between isolated semiconductor regions 13a and support structure 1 in the masked regions corresponding to the locations protected by masking material 27. In addition, the bonding surface 21 of the semiconductor regions 13a and bonding surface 19 of the support structure 1 are maintained in the masked regions. In unmasked regions, bonding interface 25 as well as bonding surface 19 and 21 are removed by the etch process.

Techniques for performing the substantially anisotropic etch process can include wet chemical etching or plasma etching techniques. In certain embodiments of the invention, plasma etching techniques are utilized to perform the anisotropic etch process including reactive ion etching (RIE), inductively couple plasma etching (ICP), electron cyclotron resonance etching (ECR) among others. For example, the III-nitrides such as InGaN are known in the art to etch efficiently in chlorine-based plasmas.

A subsequent stage of the etch process can proceed via various embodiments of the invention. The subsequent etch processes remove areas of the bonding surface of the support structure, resulting in elevated islands of semiconductor material with reduced levels of strain and substantial of a single compositional phase. An embodiment to realize partial removal of support structure bonding surface is depicted in FIGS. 1F-1G, whilst an alternative embodiment is depicted in FIG. 1F.

In the embodiment illustrated in FIGS. 1F-1G, sacrificial layer 11 is initially anisotropic etched (FIG. 1F) followed by a further isotropic etch (FIG. 1G).

The anisotropic etch process selectively etches through the unmasked regions of sacrificial layer 11 (of support structure 1), the etch progress being substantially halted by exposure of etch stop layer 9. The anisotropic etch of sacrificial layer 11 may require a different etch chemistry to that previously utilized for strained semiconductor regions 13a if sacrificial layer 11 has different etch characteristics. For example, silicon nitride/oxide sacrificial layers may be plasma etched utilizing fluorine-based chemistries as opposed to chlorine chemistries commonly utilized for III-nitride materials.

If etch stop layer 9 is employed the chemistry utilized to anisotropically etch the sacrificial layer 11 should not significantly etch the etch stop layer 9. For example, if the sacrificial layer 11 comprises silicon dioxide and the base substrate (acting as an etch stop layer) comprises sapphire, then a fluorine-based etch chemistry utilized to etch the silicon dioxide layer will not significantly etch the sapphire layer. Intermediate structure 60 (FIG. 1F) is produced following completion of the anisotropic portion of the support structure 1 etch process of this embodiment.

Subsequent etch processes of this embodiment are utilized to selectively remove portions of the sacrificial layer 11 beneath the semiconductor regions 13a without significantly etching the semiconductor regions 13a themselves, to do so, etching characteristics can be altered to substantially laterally etch sacrificial layer 11 (of the support structure 1), as illustrated in FIG. 1G. Lateral etching of the remaining sacrificial layer is utilized to remove selected areas of bonding surface 19 of the support structure thereby exposing the adjoining areas of bonding surface 21 of the semiconductor material (i.e., for every lateral fraction of the bonding surface of the support structure 1 that is removed, a corresponding fraction of the semiconductor bonding surface 19, 21 is exposed).

Lateral etching of the sacrificial layer can be performed using well-known methods in the art and can be achieved, for example, by dry plasma etching, wet chemical etching, etc. For example, plasma etching parameters can be optimized to reduce directionality of the etch process to produce a more isotropic etch characteristic, (e.g., higher pressures, lower powers etc.). In addition, lateral etching can be increased by utilizing an etch stop layer to substantially prevent vertical etching and impose increased lateral etching. Alternatively, wet chemical etching is well-known in the art to commonly produce isotropic lateral etching.

The process selected for laterally removing portions of sacrificial layer 11 should be highly selective to the sacrificial layer without significantly etching the semiconductor material. For example, a sacrificial layer comprising a silicon oxide would isotropically etch in a hydrofluoric (HF) acid containing etchant, whereas the HF etchant would not significantly etch a III-nitride material.

The lateral etch is continued until a column 11a of the sacrificial layer remains beneath the semiconductor material, the column 11a being sized sufficiently to support the elevated semiconductor island, as illustrated in FIG. 1G. In embodiments in which an etch stop layer is utilized, the height of the support column 11a is substantially the same as the thickness of the sacrificial layer. In embodiments wherein a etch stop layer is not utilized, the height of the support column 11a can be substantially different to the thickness of the sacrificial layer.

The processes outlined, therefore, produce a plurality of structures comprising a column of support material and an elevated island of semiconductor material (e.g., InGaN islands) bonded to the column through the remaining portions of bonding surfaces 19 and 21 resulting in remaining bonding interface 25, the semiconductor material of the island having a reduced level of strain and comprising a substantial single compositional phase. The bonding surface 19, 21 of the semiconductor material remains substantially unetched during the preceding processes whereas a significant portion of the bonding surface of the support structure 1 has been removed. Therefore, the surface area of the bonding surface of the semiconductor island material (i.e., a III-nitride island) is approximately greater than the surface area of the bonding surface 19, 21 of the support structure 1. The plurality of semiconductor islands comprise free surfaces 23 which are substantially within the same horizontal plane.

Semiconductor islands 13b of intermediate structure 70 are capable of strain relaxation due to the selected removal of areas of the bonding interface between the support structure and the semiconductor material. The selected removal of bonding interface 25 by the removal of the bonding surface of the support structure 1 and the exposure of the bonding surface 21 of the semiconductor material. The selected lateral removal of the support structure removes the element maintaining the strain in the semiconductor islands. Therefore upon the removal of the bonding surface of the support structure 1, the semiconductor material is able to undergo a degree of strain relaxation.

In the embodiment illustrated in FIG. 1G, the elevated islands of semiconductor material are shown schematically via arrows 28 as expanding upon the selective removal of the support structure. In this non-limiting exemplary embodiment, the semiconductor material comprises substantially single phase compressively strained indium gallium nitride (e.g., with an indium percentage of 25% $In_{0.25}Ga_{0.75}N$), which, upon removal of a portion of the strain maintaining support structure, is able to release a degree of the compressive strain and expand towards an equilibrium strain value. In embodiments of the invention in which the bonded semiconductor layer structure is under tensile strain (e.g., tensile strained AlGaN on GaN), the semiconductor will contract upon the selective removal of portions of the support structure material towards an equilibrium strain value.

An alternative embodiment for the removal of the sacrificial layer of the support structure 1 is illustrated in FIG. 1F'. In this embodiment, the sacrificial layer is etched utilizing only an isotropic etch, rather than the anisotropic/isotropic process described previously. The single step isotropic etch of the alternative embodiment commonly produces support structure column 11a, which is substantially wider at the base of the sacrificial layer in comparison to the narrow bonding surface of the support structure.

Figure 2:
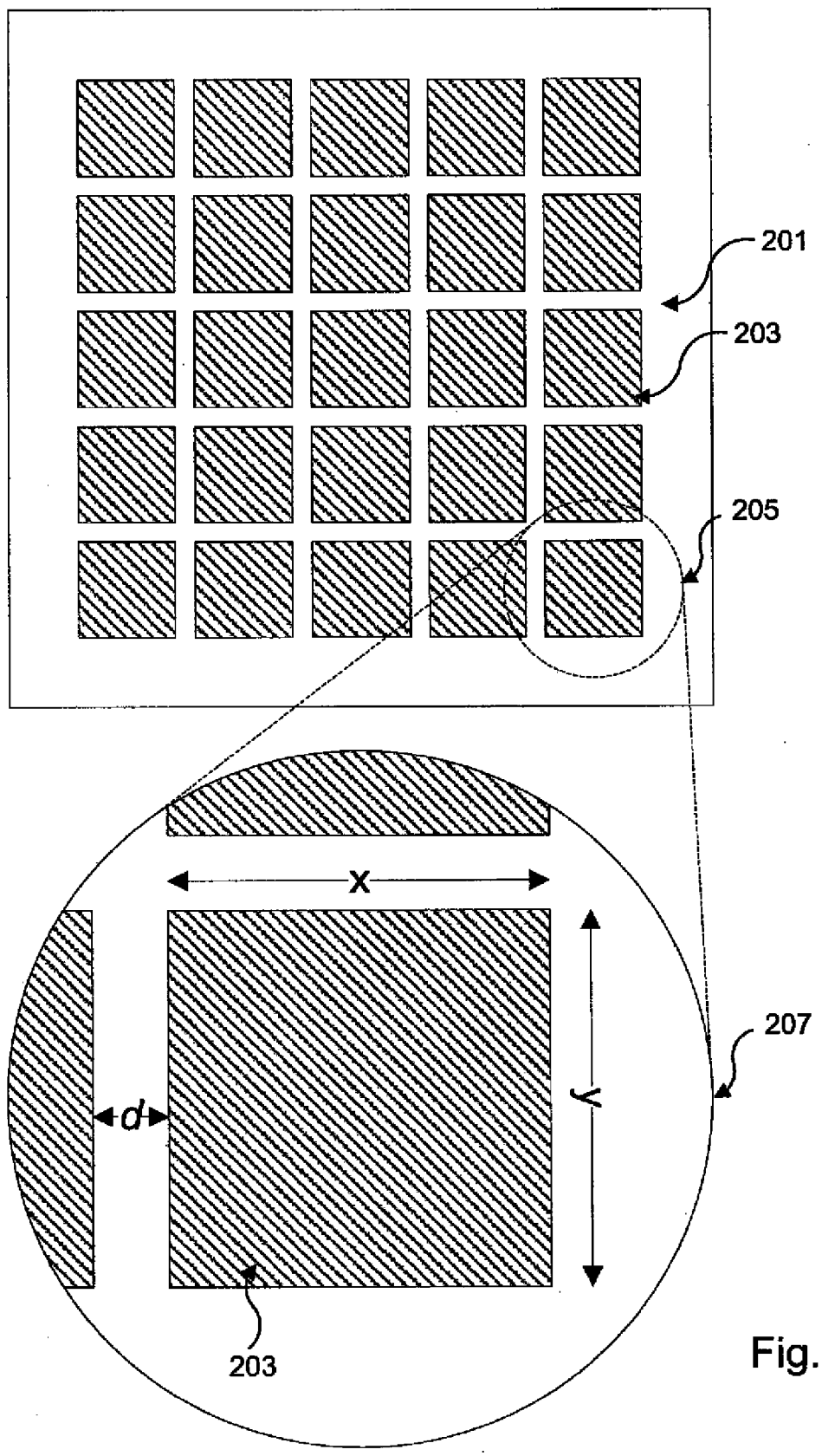
FIG. 2 schematically illustrates a plan view of a structure produced by embodiments of the invention.

FIG. 2 illustrates a plan view overhead illustration of an exemplary embodiment of the substantially single phase semiconductor islands with reduced levels of strain produced utilizing the previously described methods. FIG. 2 illustrates the semiconductor islands upon completion of the etching of the semiconductor material as well as etching of a portion of the support structure (i.e., a plan view depiction of the support structure 1 of FIG. 1G or FIG. 1F). In the depicted embodiment, semiconductor islands (i.e., III-nitride islands) with reduced levels of strain 203 overlay remaining support structure 201. In addition view 207 illustrates an expanded view of region 205 giving a closer examination of a single isolated semiconductor island structure, having dimensions x and y, with each island being separated from the neighboring island by separation distance d.

The semiconductor island structures in FIG. 2 are depicted with equally sized x and y lateral sides, forming a plurality of square islands, however, it should be appreciated that the semiconductor islands can take various sizes and dimensions depending on the subsequent usage of the material. In certain embodiments of the invention, the x and y dimensions of the substantially relaxed islands are selected to correspond to the size of a device to be fabricated upon the exposed free surface of the semiconductor island with reduced levels of strain. For example, in embodiments where the relaxed islands are utilized for the fabrication of electronic components, photovoltaic components, optic components, or opto-electronic components, the die size, can be of the order of approximately less than $2.5 \times 10^5$ μm$^2$, alternatively the die size can be of the order of approximately less than $6.25 \times 10^4$ μm$^2$, or alternatively the die size can be of the order of approximately less than $1 \times 10^4$ μm$^2$. As a non-limiting example for laser diode fabrication, the size of the islands can be designed to correspond to the width and length of the desired cavity structure.

The separation d of the islands is also an important parameter. If the strained semiconductor layer overlying the support structure is under compressive strain, for example transferred InGaN grown initially on GaN, then upon reduction in the level of strain, the III-nitride material will expand and, therefore, some degree of separation is required between islands to allow for this expansion. Another factor determining the separation of the islands is due to considerations required for producing high quality semiconductor material in subsequent lateral overgrowth process stages. If the separation d between the substantially relaxed islands is excessive, then lateral overgrowth fronts from separate islands may merge with a degree of tilt or twist in the crystal, which could deteriorate the quality of the crystal. High quality lateral overgrowth can be produced when the separation of the semiconductor islands is approximately less than 100 μm, or alternative approximately less than 30 μm, or alternative approximately less than 10 μm.

Embodiments of the invention outlined thus far have described methods for producing a plurality of structures comprising columns of support structure material elevating semiconductor island of material. For example, the semiconductor material comprises a III-nitride and wherein the III-nitride material of the islands have a reduced level of strain and a substantial singular composition. Further embodiments of the invention are now described which utilize the reduced strain semiconductor islands for producing semiconductor structures, devices and substrates.

An embodiment utilizing the semiconductor islands with reduced levels of strain is described with reference to FIGS. 3A-3C. The initial structure exploited for methods of this embodiment may be identical to that illustrated in FIG. 1G, although it should be appreciated that methods of the invention can equally well be applied to the structure illustrated in FIG. 1F'.

Figure 3A:
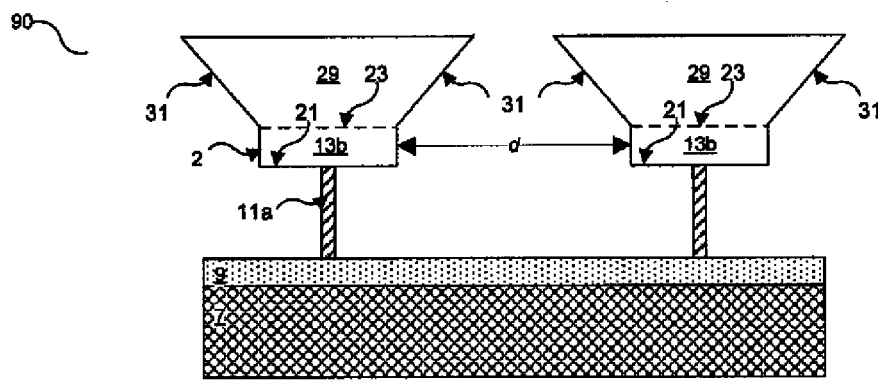
FIGS. 3A-3C schematically illustrate a specific embodiment of the invention utilizing the reduced strain layers produced as part of the formation of continuous layers of semiconductor materials.

FIG. 3A illustrates the employment of free surfaces 23 (shown by a dashed line) of the reduced strain semiconductor islands as seed crystals for lateral growth of additional semiconductor material. In greater detail, additional semiconductor material 29 is grown under conditions favoring lateral growth, initiating from the exposed free surfaces 23 of the strain relaxed semiconductor islands 13b. In certain embodiments, the growth can be initiated from the island structures in a more vertical growth mode and, upon obtaining a desired vertical height, switched to a more lateral growth mode, alternatively a lateral growth mode can be utilized from the offset. In certain embodiments, an initial vertical growth mode may be employed to provide side facets 31 from which lateral growth can be initiated. In addition, growth conditions can be selected to yield a growth mode incorporating both lateral and vertical components. Conditions suitable for obtaining vertical and lateral growth modes are known in the art.

FIG. 3A therefore illustrates an early stage in the lateral growth from free surfaces 23 of semiconductor islands 13b, with additionally laterally grown semiconductor material 29 nucleating from free surfaces 23 to produce lateral crystal growth fronts 31. Additional semiconductor material 29 deposited during the lateral growth process can be expected to inherit properties of the material on which it nucleates.

As a non-limiting example and to further develop the concept of inhering crystal properties, laterally grown additional III-nitride material that is seeded from III-nitride islands (i.e., InGaN seed crystals) can be expected to have a reduced level of strain and substantially a single compositional phase (i.e., substantially free of phase separation). In addition, since the additional III-nitride material is seeded from the III-nitride island material with reduced levels of strain, it can be expected that the additional III-nitride material can be deposited to a greater thickness and with a higher percentage of indium with reduced likelihood of initiating the on-set of phase separation. In certain embodiments, the III-nitride islands comprise a substantially single phase indium gallium nitride with an indium percentage approximately less than 25%, whereas the additional III-nitride material comprises substantially single phase indium gallium nitride with an indium percentage of approximately greater than 25%. The additional III-nitride material may be deposited utilizing MOCVD or alternatively by HVPE depending on the rate of growth required and the total layer thickness desired.

It should be noted that although additional semiconductor material growth originates extensively from the free surfaces 23 of the semiconductor islands, in reality a degree of deposition on other surfaces of the semiconductor islands of FIG. 3A may occur due to the lack of a masking material to conceal the additional surfaces of the semiconductor islands. However, in certain embodiments incorporating an etch stop layer 9, the etch stop layer 9 is selected to substantially prevent the nucleation of additional semiconductor materials, such nucleation impeding materials are commonly referred to as anti-surfactants and dielectric materials, such as silicon dioxides and silicon nitrides are known in the art to possess such anti-surfactant properties for the III-nitride materials system.

The degree of deposition on undesirable areas (i.e., facets other than free surfaces 23), may also decrease with the increasing amount of additional semiconductor material 2 formed from the free surface 23 of the semiconductor islands 13b. As the lateral growth process continues, the additional semiconductor material continues to grow laterally and growth fronts 33 converge to the point of coalescence, as illustrated in FIG. 3B. During convergence of the growth fronts 33, gas phase depletion may be experienced in the areas in the vicinity of the support structure 100 and the side facets 31 due to the inability of precursor gases to effectively combine and react, thereby to some extent preventing further deposition of semiconductor materials in those areas.

Figure 3B:
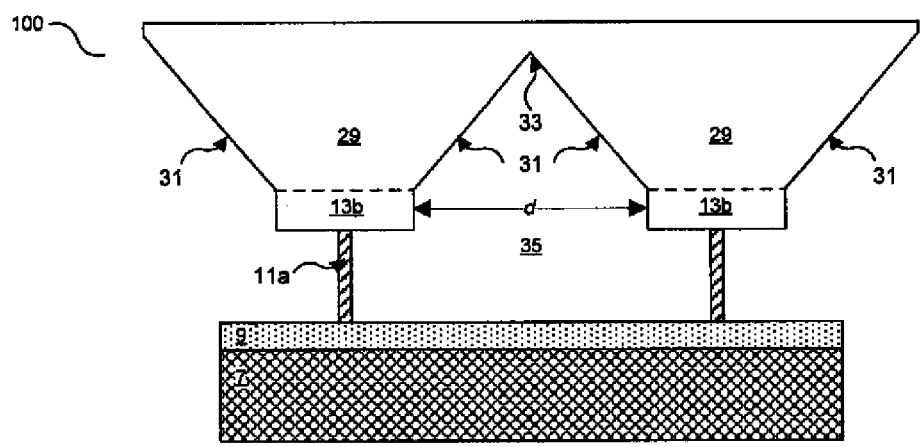

FIG. 3B illustrates the lateral growth process at the stage of coalescence of additional semiconductor material 29 to form a substantially continuous film of semiconductor material 29, for example, comprising a III-nitride such as InGaN, AlGaN etc. Semiconductor growth fronts 31 converge and merge at location 33 to form a single coalesced film of additional semiconductor material. The spatial arrangement, size and structure of the free surfaces 23 of semiconductor islands 13b are preferably optimized such as to promote a high quality lateral growth process (as previously outlined), e.g., platforms have a size, shape and distribution such as to prevent crystal tilt/twist prior to coalescence thereby substantially preventing further defect formation.

It should be noted that the methods of the embodiment not only result in the formation of a continuous layer of semiconductor material, but also in the formation of a plurality of voided areas 35 situated between the coalesced semiconductor material. The spatial extent of the voided regions is dependent on the distribution and density of the semiconductor islands and the degree the lateral growth process favors vertical vs. lateral growth during the coalescence growth stage.

Figure 3C:
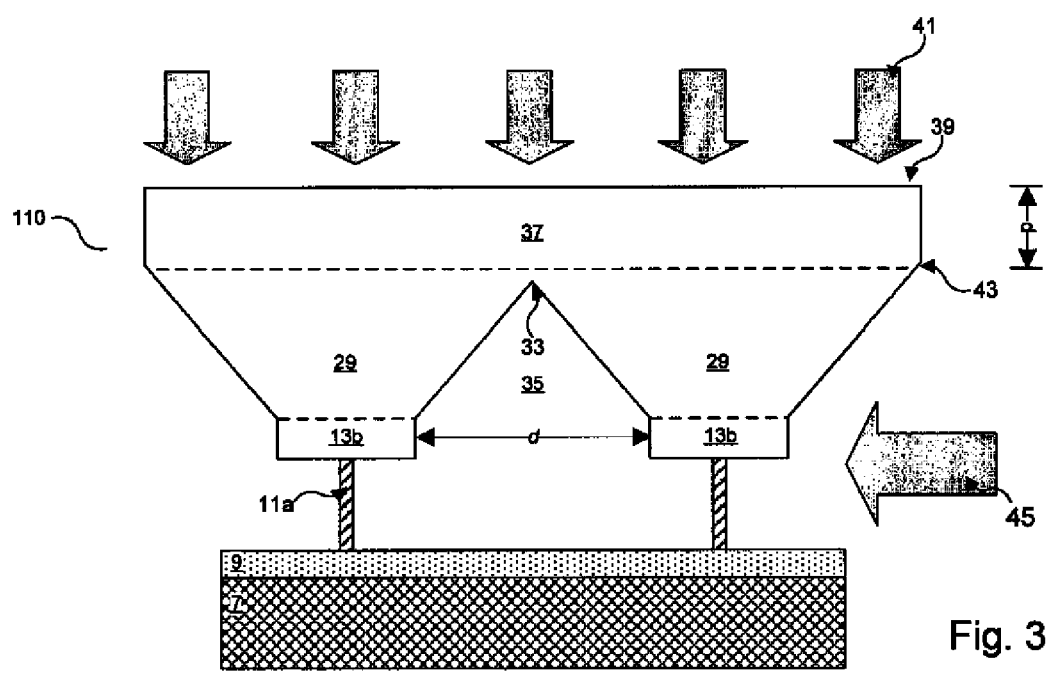

Upon coalescence of the semiconductor film, the growth mode can be altered, if desired, to more a vertical extent to produce a continuous film to a desired thickness, as shown in FIG. 3C. The thickness of the resulting layer 2 can be less than approximately 1 μm, or to approximately 100 μm, or to approximately 500 μm, or to approximately 100 μm.

Resulting continuous semiconductor layer 37 may be employed for the fabrication of electronic components, photovoltaic components, optic components, or opto-electronic components, etc. In alternative embodiments of the invention either a portion or the entire continuous semiconductor layer 37 can be transferred from intermediate structure 110 for producing free-standing or composite-type substrates. Transfer processes can proceed with detachment of a portion of the continuous semiconductor layer 37 and may also include bonding techniques.

In certain embodiments, a portion of continuous semiconductor layer 37 can be detached from intermediate structure 110 through ion implantation and separation techniques, for example using techniques referred to as SMART CUT™. Such processes are described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., the disclosures of each of which are incorporated herein in their entirety by this reference for all purposes.

Briefly, surface 39 of continuous semiconductor layer 37 is exposed to ions (e.g., Hydrogen, Helium etc.), as represented by arrows 41 of FIG. 3C, forming a zone of weakness 43. The depth d of the zone of weakness 43 into the continuous layer can be varied and is dependent on the parameters of the implantation process. The implanted intermediate structure 110 is subsequently exposed to further energy (e.g., thermal, mechanic, chemical) to detach a portion of the substantially continuous layer of semiconductor material 37 at the zone of weakness 43. In exemplary embodiments, the detachment process may take place in conjunction with bonding of a portion of layer 37 to a secondary carrier wafer.

In particular embodiments of the invention, the additional semiconductor material 37 is deposited to a sufficient thickness to be self supporting, for example approximately greater than 300 μm for III-nitrides, in such embodiments, a secondary carrier wafer may not be required. In an alternative embodiment of the invention wherein the portion of additional semiconductor material to be removed from the substantially continuous layer of semiconductor material is not of a sufficient thickness to be self supporting, then surface 39 of the continuous layer can be bonded to a secondary carrier for mechanic support. In either embodiment and by non-limiting example, a III-nitride substrate (either free-standing or composite) can be produced, which can comprise an upper exposed surface comprising Ga-polar, N-polar, semi-polar or non-polar, depending on the polarity of the material initial bonded to the support structure of FIG. 1A.

In alternative embodiments of the invention, detachment processes for transferring the continuous layer of semiconductor material employ the aforementioned plurality of voided regions 35 in intermediate structure 110 (FIG. 3C). The voided regions may act as localized weakened zones within the structure whereby the application of external energy to the voided regions can result in the detachment of continuous semiconductor layer 37 from the remaining structure. In certain embodiments, the separation is performed by apply an external force 45 (e.g., thermal, chemical and mechanical) to intermediate structure 110 in such way as to separate continuous semiconductor layer 37. As noted in the previous embodiment, the process of detachment may incorporate bonding of surface 39 of the continuous semiconductor layer 37 to a secondary carrier.

An alternative embodiment utilizing the semiconductor islands with reduced levels of strain for producing substantially continuous layers of semiconductor materials is now described with reference to FIGS. 4A-4E. As with previous embodiments, the initial starting structure may be identical to that illustrated in FIG. 1G, although again it should be appreciated that methods of the invention can equally well be applied to the structure illustrated in FIG. 1F'.

The alternative utilization of the semiconductor islands with reduced levels of strain differs from those previously described in that an addition backfill and planarization process may also be employed. The backfill material is selected such that it substantially prevents the nucleation of additional semiconductor material, therefore upon planarization of the backfill material the semiconductor islands 13b (i.e., seed crystals) utilized for further semiconductor material comprises only the free surface 23 of the semiconductor islands 13b, the other, possibly less preferable, surfaces of the semiconductor islands 13b are masked and are therefore unavailable for initiating growth.

Figure 4A:
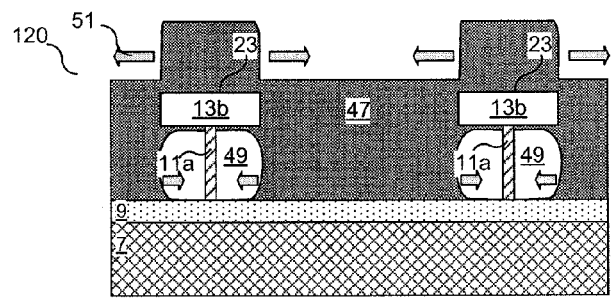
FIGS. 4A-4E schematically illustrate an alternative embodiment of the invention utilizing the reduced strain layers produced as part of the formation of continuous layers of semiconductor materials.
Figure 4B:
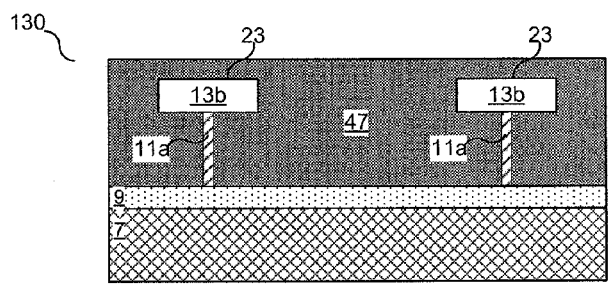

The embodiment commences as illustrated in FIG. 4A with the deposition and reflow of a backfill material 47 over intermediate structure 120 (FIG. 1G). Due to the geometric shape of intermediate structure 120 it is difficult using standard deposition techniques to completely fill the etched portions of the intermediate structure 120 without forming a plurality of undesirable voids 49 due to the shadowing nature of the elevated semiconductor islands 13b over the underlying support structure 1. In addition, due to the substantial conformality of common deposition techniques, the surface of intermediate structure 120 is non-planar requiring further process stages to produce a desired surface for subsequent growth. Therefore, standard deposition techniques such as PECVD, PVD, alone may not be adequate and techniques that utilize deposition of a reflowable glassy material and planarization are utilized, such techniques are well-known in the art, for example in U.S. Pat. Nos. 6,214,698 and 5,225,358.

Briefly, reflowable glassy material 47 is deposited over the entire intermediate structure and then heated above reflow temperature (i.e., above the glass transition temperature at which the glass becomes more liquid like), at which point the majority of voids are removed, as illustrated in FIG. 4A wherein the direction arrows 51 indicate the flow direction of the glassy material 47 above the glass transition temperature. Such glassy materials can comprise low temperature oxides (LTO), phosphosilicate glasses (PSG), borosilicate (BSG), boronphosphosilicate glasses (BPSG), polyimides, Quasi-inorganic SOGs Siloxanes (methyl-, ethyl-, phenyl-, butyl-, doped, undoped), purely-inorganic SOGs and silicates (doped or undoped). In exemplary embodiments BPSG is utilized as the reflow glass due to the superior materials characteristics and optimal temperature behavior. BPSG can be deposited utilizing various methods known in the art including CVD, PECVD, spin-coating techniques etc.

Intermediate semiconductor structure 120 is heated (e.g., oven, furnace, deposition reactor) to decrease the viscosity of the glassy material 47, the reflow temperature being dependent on the composition of the glassy material 47. For example, the reflow temperature of BPSG is dependent on the percentage content of boron and phosphorous, as a non-limiting example for approximately 4% B and approximately 4% P, the reflow temperature is ≈above 800° C.

Figure 4C:
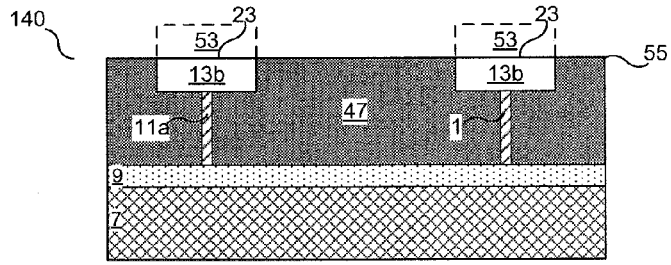

A number of methods can be utilized to remove the excess glassy material 47 in order to planarize intermediate structure 130 (FIG. 4B) and to produce intermediate structure 140, as illustrated in FIG. 4C. In certain methods, an etch back process can be utilized employing wet or dry chemical etching. However, a planarization etch process may be complex due to the possible dissimilarity in etch resistances between the semiconductor islands 13b and the glassy material 47. In alternative methods, chemical mechanical polishing (CMP) is employed; such a technique may be desirable, for example, in embodiments involving the III-nitrides since the III-nitride material can be considerably physically harder than the glassy material 47. Therefore, the III-nitride material may substantially prevent further material removal upon exposure of free surfaces 23 from the glassy material 47, as illustrated in FIG. 4C.

Upon the completion of the planarization process, intermediate structure 140 comprises an exposed surface comprising free surfaces 23 of the semiconductor islands 13b (e.g., InGaN) with reduced strain and substantially phase-separation free material. Surrounding the semiconductor islands is glassy material 47 capable of substantially preventing the nucleation of further semiconductor material.

Intermediate structure 140 (FIG. 4C) can be utilized in a number ways. In one embodiment, a device structure 53 (shown in phantom) may be deposited on the free surfaces 23 of the plurality of semiconductor islands. In the non-limiting case of semiconductors of polar III-nitrides the free surface 23 can comprise Ga-polar or N-polar material depending on the polarity of the transferred material of FIG. 1A. Therefore device structures can be deposited, depending on the particular application required, either N-polar or Ga-polar due to polarity inheritance from the seed crystal. The device structure can comprises a plurality of layers and materials and can function as various device classes previously outlined. Since the glassy material 47 surrounding the semiconductor islands 13b can be selected to act as an anti-surfactant, the glassy material 47 can substantially prevent the deposition of further semiconductor material on the glassy material 47 during formation of the device structures.

In alternative embodiments of the invention surface 55 of intermediate structure 140 comprises lateral overgrowth seed regions, comprising the free surface 23 of the island materials, and masked regions comprising the glassy material 47, i.e., a surface equivalent to that commonly utilized in the prior art for high quality lateral overgrowth techniques.

Figure 4D:
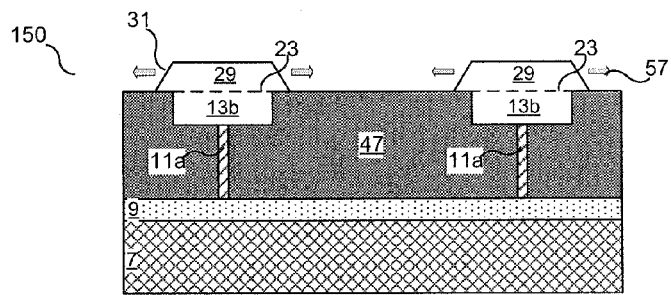

The intermediate structure 150 of FIG. 4D illustrates an early stage in the lateral overgrowth process from free surfaces 23 of the semiconductor islands 13b. Additional overgrown semiconductor material 29 nucleates from free surfaces 23 with lateral crystal growth fronts 31. Additional semiconductor material 29 deposited during the lateral growth process can be expected to inherit properties of the material on which it nucleates, as previously stated, likewise additional material can be deposited by deposition methods previously outlined.

Lateral growth can be initiated from the semiconductor island structures in a more vertical growth mode or lateral growth mode or mixture there of depending on the desired process, as known in the art. In the exemplary embodiment illustrated in FIG. 4D additional semiconductor material growth may be maintained in a lateral fashion as shown by arrows 57 indicating the growth direction. The glassy material 47 between the growth fronts can substantially prevent the nucleation of additional material, in addition the technique may result in a reduction in crystal defects in the material produced. As in the previous embodiments, the semiconductor islands 13b with reduced levels of strain and substantially phase-separation free are sized and spaced to ensure a high quality crystal upon coalescence of the crystal growth fronts.

Figure 4E:
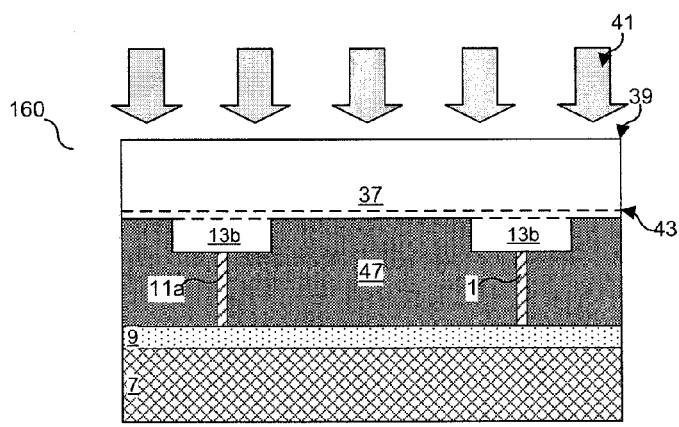

Upon coalescence of the semiconductor film the growth mode can be altered, if desired, to more a vertical extent to produce a continuous film to a desired thickness, as shown in FIG. 4E. The resulting substantially continuous semiconductor layer 37 can have thicknesses as described in the previous outlined and has reduced levels of strain as the seeds utilized for growth comprised reduced strain III-nitride.

As previously outlined the resulting substantially continuous film of semiconductor material can be utilized in a number of ways, including device and substrate (either freestanding or composite) formation. In preferred embodiments, portions of the semiconductor material are detached from intermediate structure 160 (for example utilizing ion implantation) for the formation of composite substrate as previously described and illustrated in FIG. 4E.

A number of examples are now described to illustrate further embodiments of the invention. It should be understood that the in the following examples, physical parameters (e.g., times, temperatures etc.) are for illustrative purposes only and are not to be taken as limiting.

Example 1

With reference to FIG. 1A, a composite substrate 5 comprising a ("0001" orientation) sapphire base 17 with a 2 μm surface layer of Ga-polar gallium nitride 15 is employed as the deposition base for the subsequent strained semiconductor layer 13. Strained semiconductor layer 13 comprises $In_{0.15}Ga_{0.85}N$, grown by MOCVD at a temperature of 700° C. to a thickness of approximately 20 nm. Due to the large lattice mismatch between the underlying GaN of the composite substrate 5 and the $In_{0.15}Ga_{0.85}N$ layer a high level of compressive strain is present in the $In_{0.15}Ga_{0.85}N$, however since the $In_{0.15}Ga_{0.85}N$ is maintained below the critical thickness it contains a reasonably low level of defects on the order of $5 \times 10^8$ cm$^{-2}$.

Support structure 1 (FIG. 1A) comprises a (0001) sapphire base 7, a 300 nm silicon nitride-based etch stop layer 9 and a 1 μm sacrificial layer 11 comprising a silicon dioxide material. The bonding surface 19 of the silicon dioxide sacrificial layer 11 has a surface roughness of approximately less than 15 Å to ensure a high quality bond can be produced. The bonding surface 19 of the silicon dioxide sacrificial layer 11 and the bonding surface 21 of the $In_{0.15}Ga_{0.75}N$ layer 13 are brought into direct contact and through the application of heat and pressure bonding interface 25 is formed between the two separate articles, as illustrated in FIG. 1B.

Upon bonding of the support structure 1 and the $In_{0.15}Ga_{0.85}N$ layer, composite substrate 5 is removed utilizing, for example, laser-off through the face of the sapphire opposed to the $In_{0.15}Ga_{0.85}N$ layer. The remaining GaN (intermediate layer 15) of the composite substrate 5 is removed utilizing a chlorine-based (ICP) ion etch, thus exposing the free surface of the $In_{0.15}Ga_{0.85}N$ layer and producing intermediate structure 30, as illustrated in FIG. 1C.

A photosensitive chemical is dispensed and spin-coated over the free surface of the $In_{0.15}Ga_{0.85}N$ layer and exposed to a UV-light source through a photolithographic mask, as is well-known in the art. Upon exposure to light the photosensitive chemical is developed in the appropriate chemicals thus forming masking layer 27 and producing intermediate structure 40 (FIG. 1D).

A chlorine-based (e.g., $BCl_3$, $Cl_2$, $SiCl_4$) ICP ion etch is utilized to remove the portions of the $In_{0.15}Ga_{0.85}N$ layer that are exposed through masking layer 1, thereby removing $In_{0.15}Ga_{0.85}N$ layer in unmasked regions to produced isolated $In_{0.15}Ga_{0.85}N$ regions 13a and intermediate structure 50 (FIG. 1E). A further fluorine-based plasma (e.g., utilizing a heavy perfluorocarbon, for example, hexafluorobutadiene ($C_4F_6$) or hexafluorobenzene ($C_6F_6$)) is utilized to anisotropically remove portions of the silicon dioxide-based sacrificial layer 11 whilst maintaining the silicon nitride-based etch stop layer 5 forming intermediate structure 60 (FIG. 1F).

A wet chemical hydrofluoric acid (HF)-based etchant is utilized to isotropically etch sacrificial layer 11, thereby removing selected areas of the sacrificial layer and the bonding surface 19 of the support structure 1 (FIG. 1G). The etchant is maintain in contact with the sacrificial layer 11 until only a column of support structure 11a material remains at which point the sacrificial layer 11 is removed from the etchant and rinsed in deionized water to remove any remaining etchant, thereby producing a plurality of elevated semiconductor islands 13b structures as illustrated in FIG. 1G, intermediate structure 70. $In_{0.15}Ga_{0.85}N$ islands 13b are able to expand due to the removal of portions of the strain maintaining support structure resulting in strain relaxed $In_{0.15}Ga_{0.85}N$ layer islands with substantially a single composition. $In_{0.15}Ga_{0.85}N$ islands 13b with reduced levels of strain and substantially phase-separation free of FIG. 1G are N-polar in nature due to the proceeding transfer process.

Example 2

Many aspects of this example are similar to those outlined in the previous example and therefore the description will concentrate on the elements that are distinct from the previous example.

An initial growth substrate is utilized for the deposition of a 5 μm thick layer of Ga-polar GaN by well-known methods in art, utilizing MOCVD deposition techniques. The exposed upper Ga-polar surface of the GaN layer is then brought into contact with an intermediate support structure to produce a bonding interface between the Ga-polar surface of the GaN layer and the intermediate support structure. The original growth substrate is subsequently removed utilized laser-lift-off to produce composite substrate 5 comprising the now N-polar surface GaN intermediate layer 15.

The composite substrate 5 is utilized as outlined in example 1 for the growth of $In_{0.15}Ga_{0.85}N$ and formation of a plurality of elevated semiconductor islands as illustrated in FIG. 1G. However, in this example $In_{0.15}Ga_{0.85}N$ islands 1 are not only strain relaxed with substantially a single composition but are also Ga-polar in nature due to the formation of the proceeding composite substrate.

Example 3

Many aspects of this example are similar to those outlined in the previous examples and therefore the description will concentrate on the elements which are distinct from the previous examples.

The plurality of N-polar structures produced by methods of example 1 are utilized as seed crystals, as illustrated schematically in the embodiments of FIGS. 4A-E. A borophosphosilicate glass (BPSG) 47 is deposited by chemical vapor deposition to conformally cover intermediate structure 70 of FIG. 1G, thereby producing intermediate structure 120 of FIG. 4A. Intermediate structure 120 is subjected to a heating process via a high temperature furnace up to a temperature of 850° C., at which stage reflow of the BPSG glass takes place filing voided regions 49. A chemical mechanical polishing process with a suitable slurry, is utilized to remove excess BPSG to reveal the free surfaces 23 of the $In_{0.15}Ga_{0.85}N$ islands 13b, thereby producing intermediate structure 140 (FIG. 4C). Epitaxial lateral overgrowth is initiated from the free surface of the $In_{0.15}Ga_{0.85}N$ islands 23, the additional III-nitride material 29 comprising $In_{0.25}Ga_{0.75}N$ (FIG. 4D). Upon coalescence of the substantially continuous $In_{0.25}Ga_{0.75}N$ film, the growth conditions are altered to produce a more vertical growth mode to produce $In_{0.25}Ga_{0.75}N$ layer of 200 μm 37 (FIG. 4E).

Methods known in the art utilizing SMART CUT™ technologies and bonding to a support structures are utilized to separate a portion of the $In_{0.25}Ga_{0.75}N$ film for use as further composite substrates. Ions 41 are implanted into surface 39 of the substantially continuous layer of semiconductor material 37 to produce a zone of weakness 43. An addition support substrate (not shown) is attached to surface 39 through wafer bonding techniques and thermal energy is applied to separate a portion of the continuous layer of semiconductor material at the zone of weakness 43.

The exemplary embodiments of the invention described above do not limit the scope of the invention, since these embodiments are illustrations of several aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A method for forming a semiconductor structure, comprising:

forming a strained semiconductor layer on a base substrate;
forming a bonding interface between a bonding surface of the strained semiconductor layer and a bonding surface of a support structure;
removing the base substrate; and
selectively etching the semiconductor layer and the bonding surface of the support structure thereby exposing adjoining areas of the bonding surface of the semiconductor layer, whereby exposing adjoining areas of the bonding surface of the semiconductor layer produces a plurality of semiconductor islands with reduced levels of strain.

2. The method of claim 1, wherein removing selected areas of the bonding surface of the support structure further comprises:
masking areas of a free face of the semiconductor layer;
anisotropically etching unmasked areas of the semiconductor layer; and
isotropically etching the support structure.

3. The method of claim 1, further comprising the formation of device structures on the plurality of semiconductor islands with reduced levels of strain.

4. The method of claim 1, further comprising forming a substantially continuous layer of semiconductor material from the plurality of semiconductor islands with reduced levels of strain,
whereby the substantially continuous layer of semiconductor material inherits the reduced levels of strain from the plurality of semiconductor islands.

5. The method of claim 4, wherein forming a substantially continuous layer of material further comprises:
performing lateral growth from the free surface of the plurality of semiconductor islands with reduced levels of strain.

6. The method of claim 1, further comprising depositing, reflowing and planarizing a layer of reflowable glassy material.

7. The method of claim 1, wherein the semiconductor layer comprises a III-nitride semiconductor.

8. The method of claim 4, wherein the substantially continuous layer of semiconductor material is substantially free of phase separation.

9. A method for reducing strain in III-nitride structures comprising:
forming a strained III-nitride layer on a base substrate;
bonding the strained III-nitride layer to a support structure;
removing the base substrate;
selectively etching the strained III-nitride layer to expose the support structure;
selectively laterally etching the support structure; and
forming a continuous III-nitride layer with reduced levels of strain by performing lateral growth from unetched portions of the III-nitride layer.

10. The method of claim 9, further comprising, depositing, reflowing and planarizing a layer of reflowable glassy material.

11. The method of claim 9, wherein selectively etching the strained III-nitride layer is performed utilizing anisotropic plasma etching.

12. The method of claim 9, wherein selectively laterally etching the support structure is performed utilizing wet chemical etching.

13. The method of claim 9, wherein the support structure includes an etch stop layer comprising a dielectric material capable of substantially preventing nucleation of III-nitride material.

14. The method of claim 9, further comprising a deposition of a device structure on the continuous III-nitride layer.

15. The method of claim 9, wherein a portion of the continuous III-nitride layer of material is detached utilizing ion implantation.

16. The method of claim 9, wherein a portion of the continuous III-nitride layer of material is detached utilizing a plurality of voided regions.

* * * * *